United States Patent
Yang et al.

(10) Patent No.: US 7,696,535 B2
(45) Date of Patent: Apr. 13, 2010

(54) GALLIUM NITRIDE HIGH ELECTRON MOBILITY TRANSISTOR HAVING INNER FIELD-PLATE FOR HIGH POWER APPLICATIONS

(75) Inventors: Kyounghoon Yang, Daejeon (KR); Sungsik Lee, Gyeongsangnam-do (KR); Kiwon Lee, Chungcheongbuk-do (KR); Kwangui Ko, Gyeonggi-do (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 12/495,974

(22) Filed: Jul. 1, 2009

(65) Prior Publication Data

US 2009/0261384 A1    Oct. 22, 2009

Related U.S. Application Data

(62) Division of application No. 11/716,446, filed on Mar. 8, 2007, now abandoned.

(30) Foreign Application Priority Data

Sep. 22, 2006    (KR) ...................... 10-2006-0092255

(51) Int. Cl.
*H01L 29/778*    (2006.01)
*H01L 29/80*    (2006.01)

(52) U.S. Cl. .................. 257/194; 257/339; 257/340; 257/E29.009; 257/E29.01; 257/E29.011; 257/E29.247; 257/E29.248; 257/E29.249; 257/E29.25

(58) Field of Classification Search .................. 257/194, 257/339, 340, E29.009, E29.01, E29.011, 257/E29.247, E29.248, E29.249, E29.25
See application file for complete search history.

(56) References Cited

U.S. PATENT DOCUMENTS

| 2002/0167023 | A1 | 11/2002 | Chavarkar et al. |
| 2005/0253168 | A1* | 11/2005 | Wu et al. ..................... 257/192 |
| 2007/0059873 | A1* | 3/2007 | Chini et al. .................. 438/199 |

OTHER PUBLICATIONS

IEEE Electron Device Letters, vol. 25, No. 4, Apr. 2004, pp. 161-163 High Breakdown Voltage AlGaN-GaN HEMTs Achieved by Multiple Field Plates, by Huili Xing et al.
Japanese Journal of Applied Physics, vol. 43, No. 4B, 2004, pp. 2239-2242 "Design and Demonstration of High Breakdown Voltage GaN High Electron Mobility Transistor (HEMT) Using Field Plate Structure for Power Electronics Applications", by Wataru Saito et al.
IEEE Transactions on Electron Devices, vol. 53, No. 6, Jun. 2006, pp. 1477-1480.

* cited by examiner

*Primary Examiner*—Eugene Lee
*Assistant Examiner*—Peniel M Gumedzoe
(74) *Attorney, Agent, or Firm*—Bachman & LaPointe, P.C.

(57) ABSTRACT

A gallium nitride high electron mobility transistor, in which an inner field-plate is disposed between the gate and drain of the high electron mobility transistor, so that an electric field is distributed between gate and drain regions to reduce a peak value and to reduce gate leakage current while maintaining high frequency performance, thus obtaining a high breakdown voltage, reducing the capacitance between the gate and the drain attributable to a shielding effect, and improving linearity and high power and high frequency characteristics through variation in the input voltage of the inner field-plate.

9 Claims, 8 Drawing Sheets

[Figure 1]
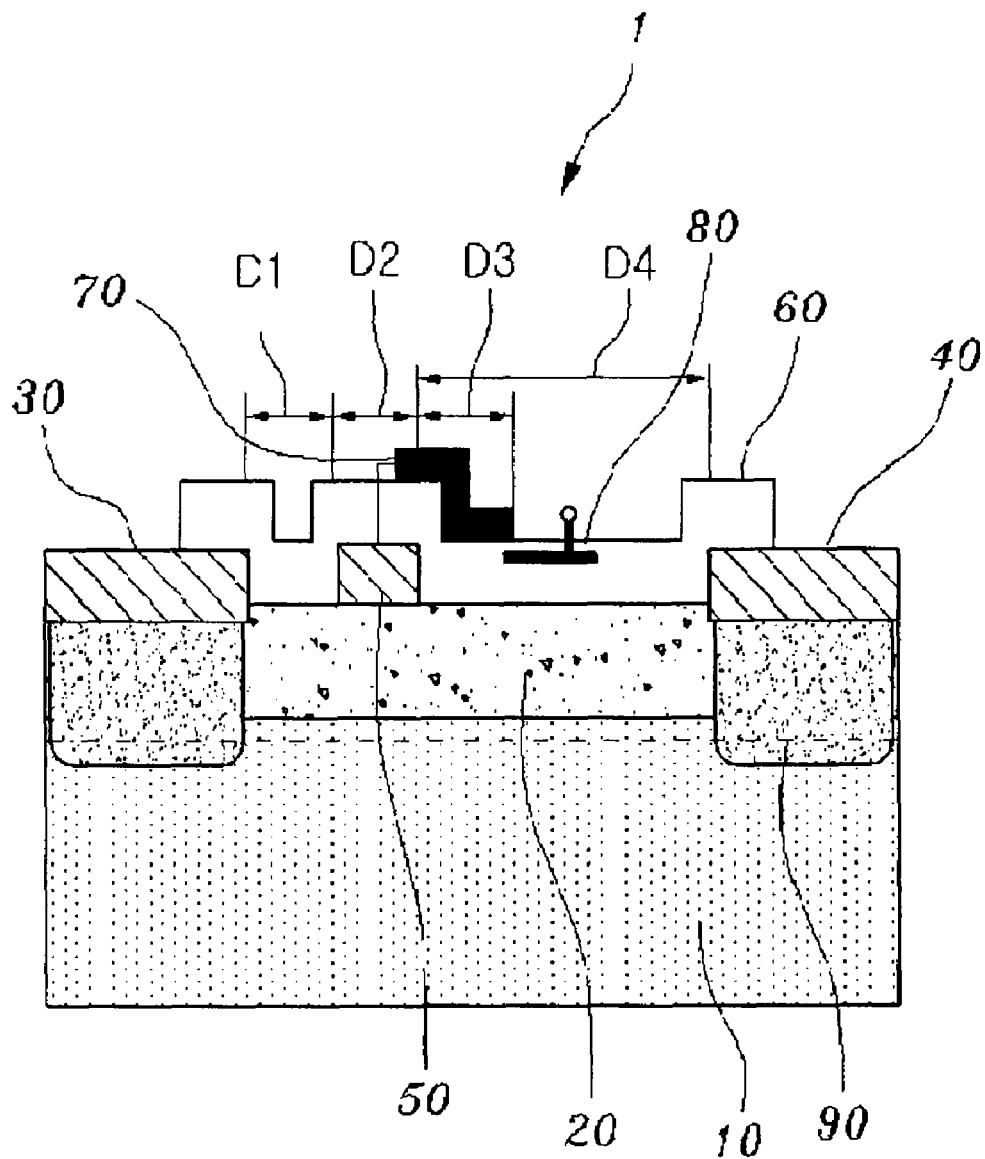

[Figure 2]
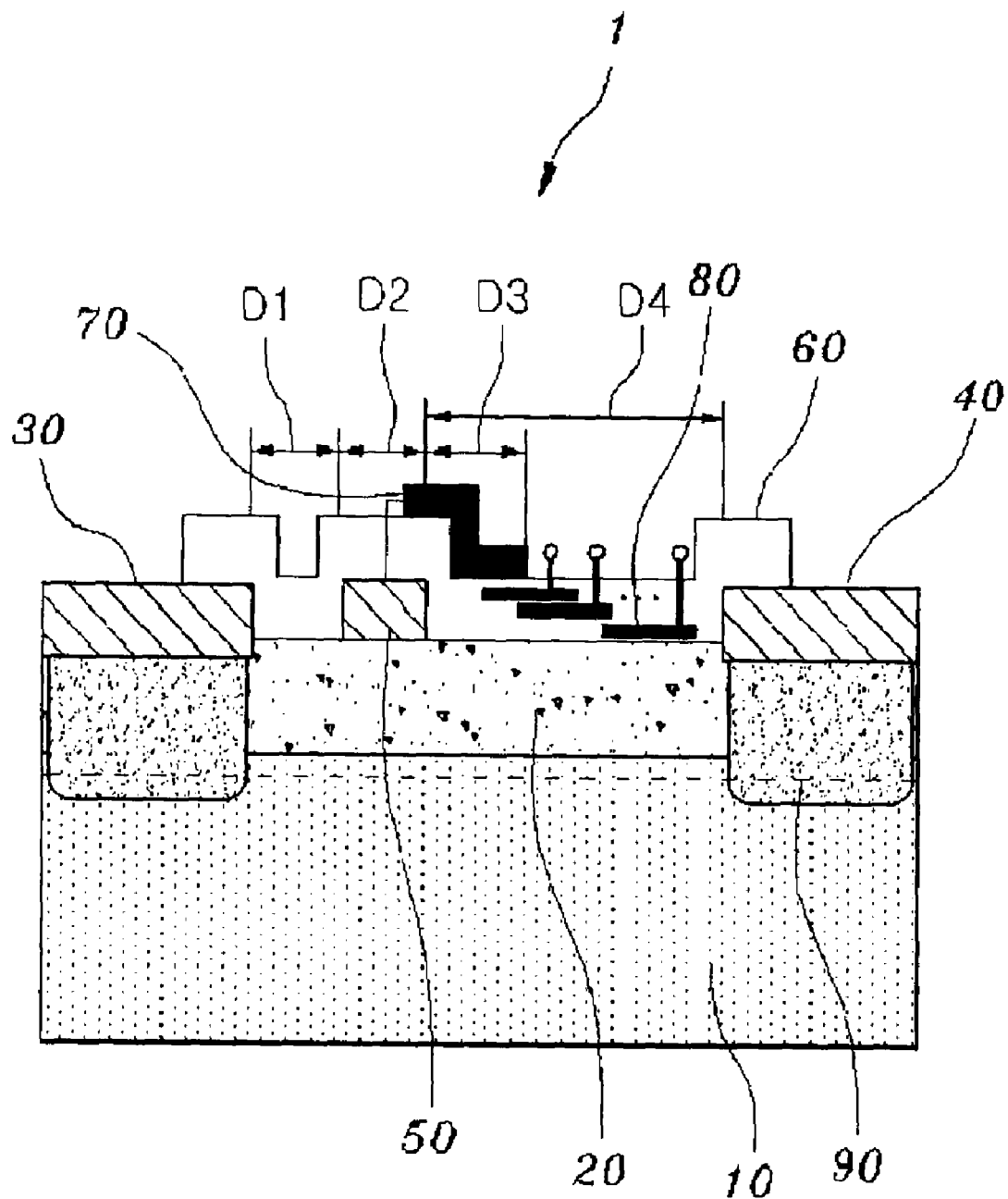

[Figure 3]
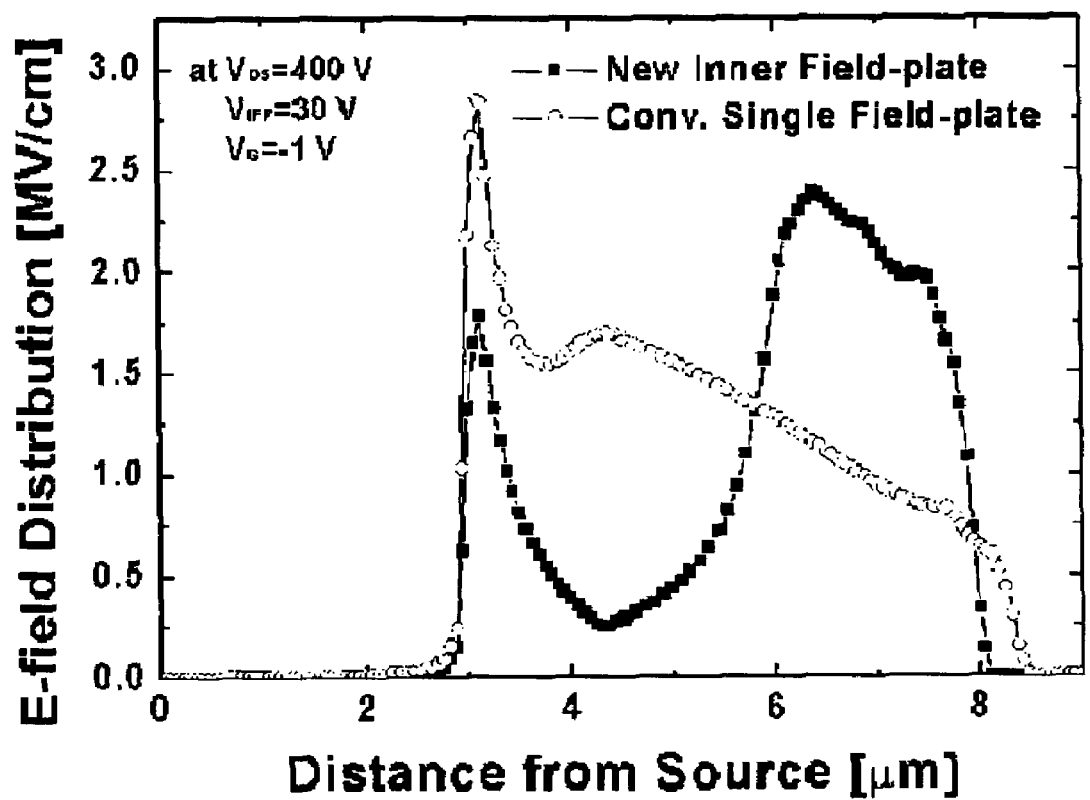

[Figure 4]
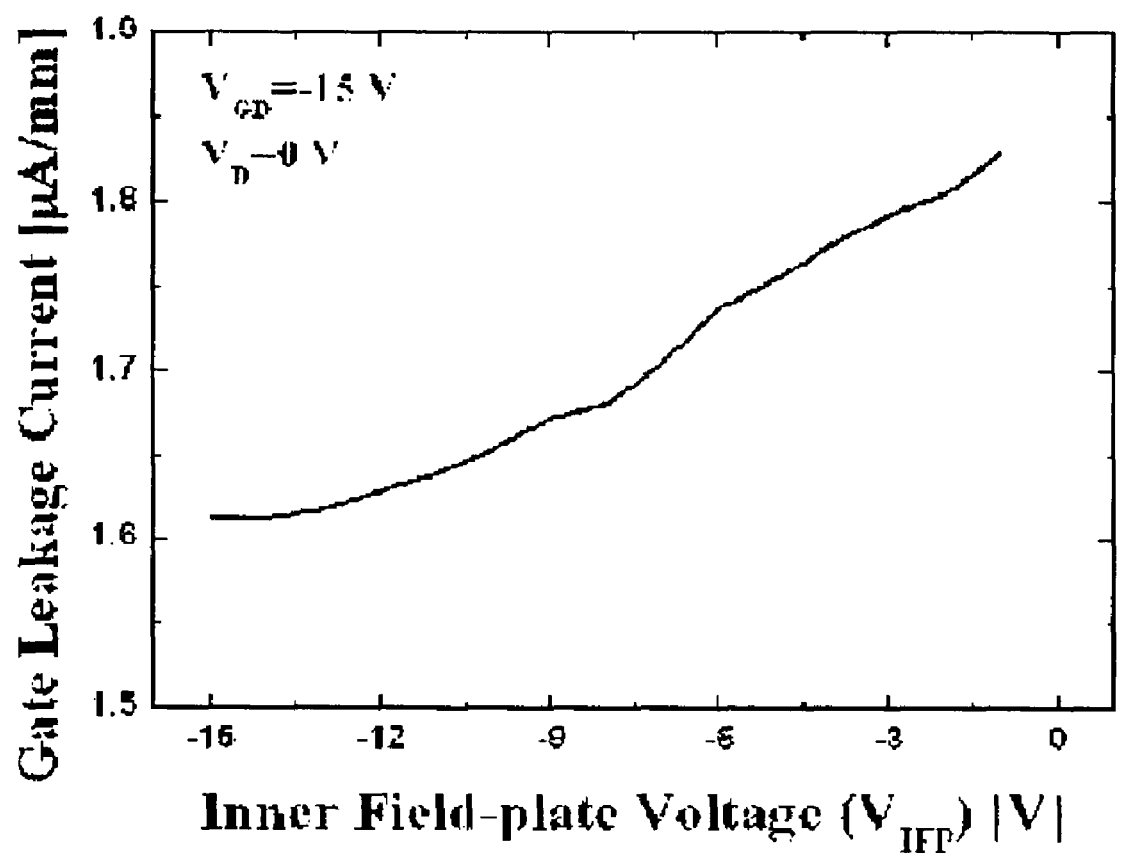

[Figure 5]
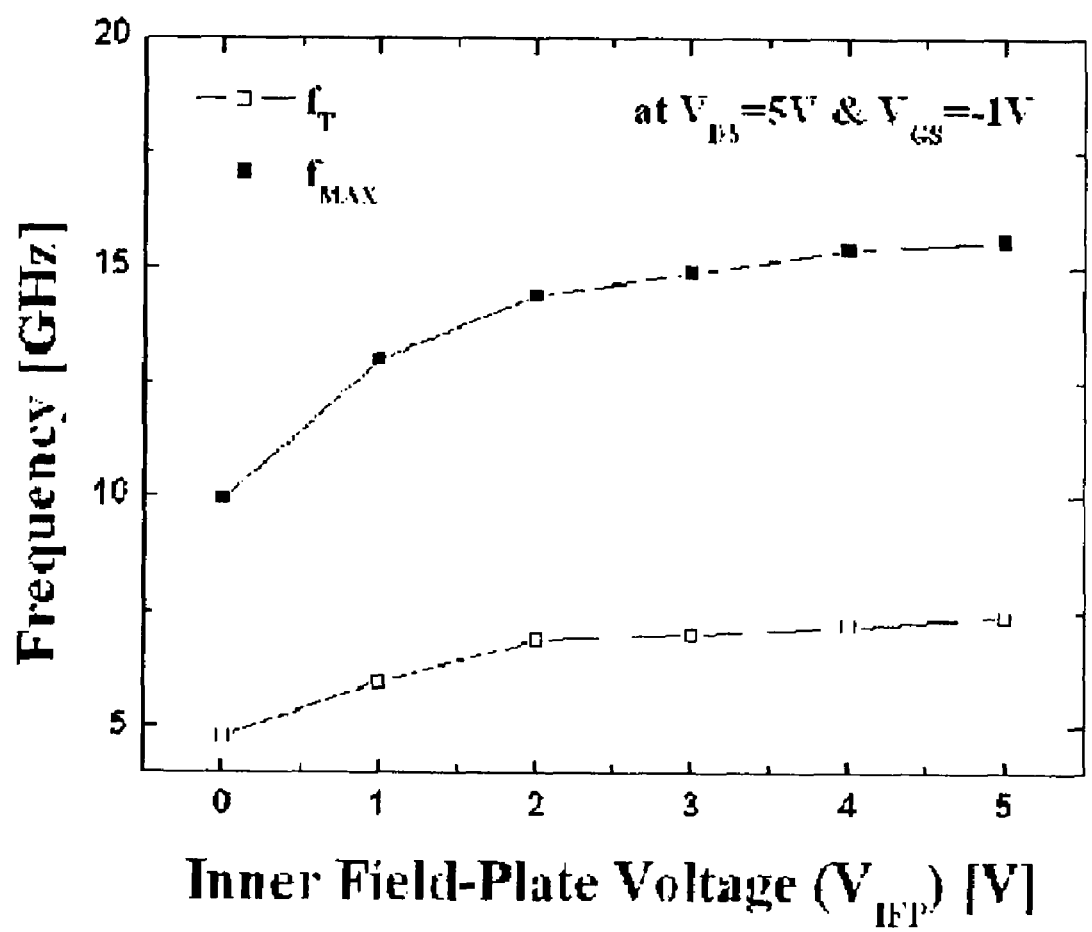

[Figure 6]
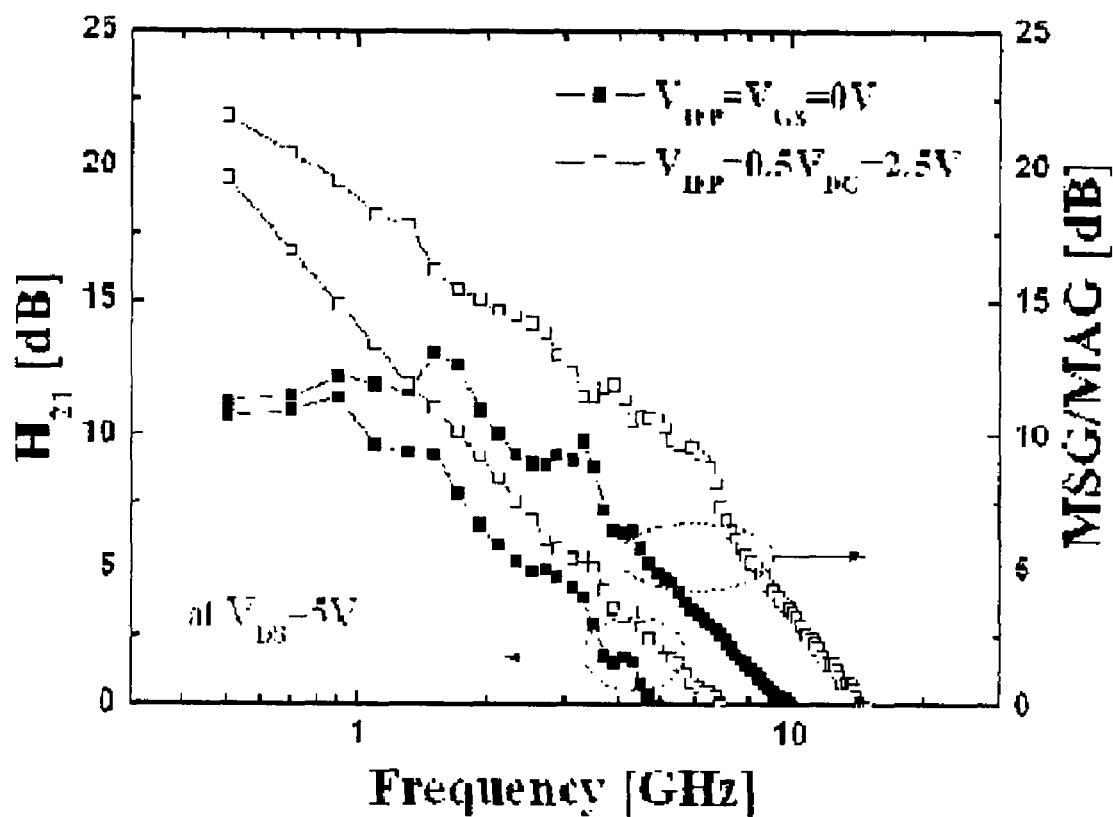

[Figure 7]
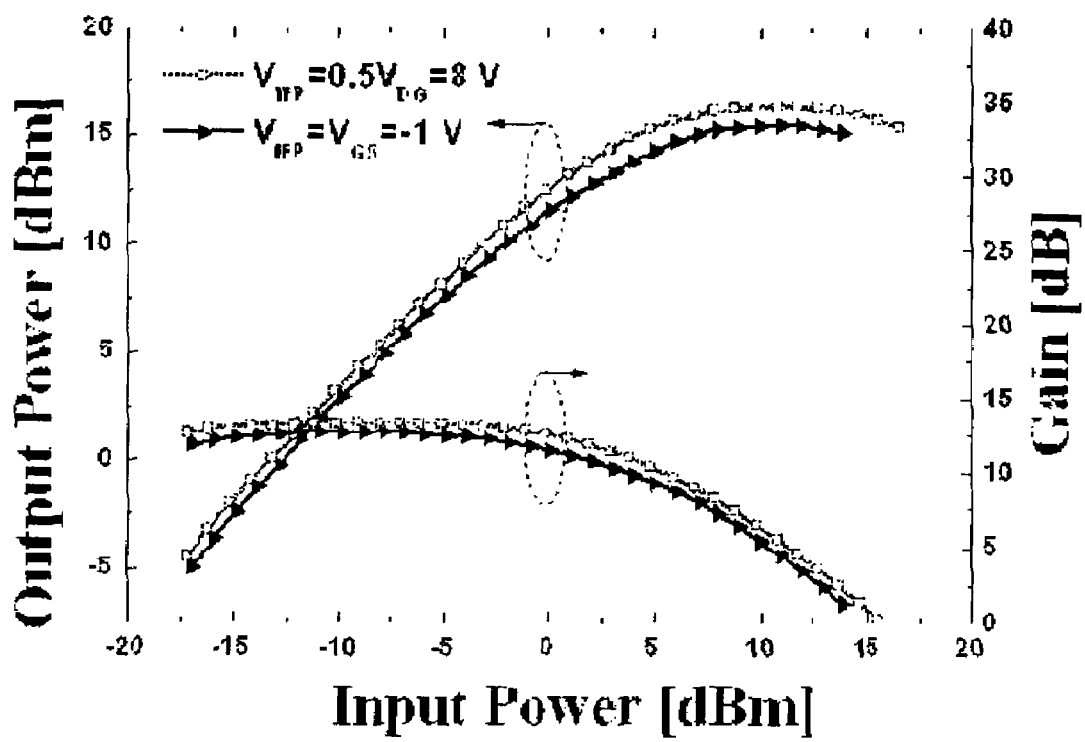

[Figure 8]
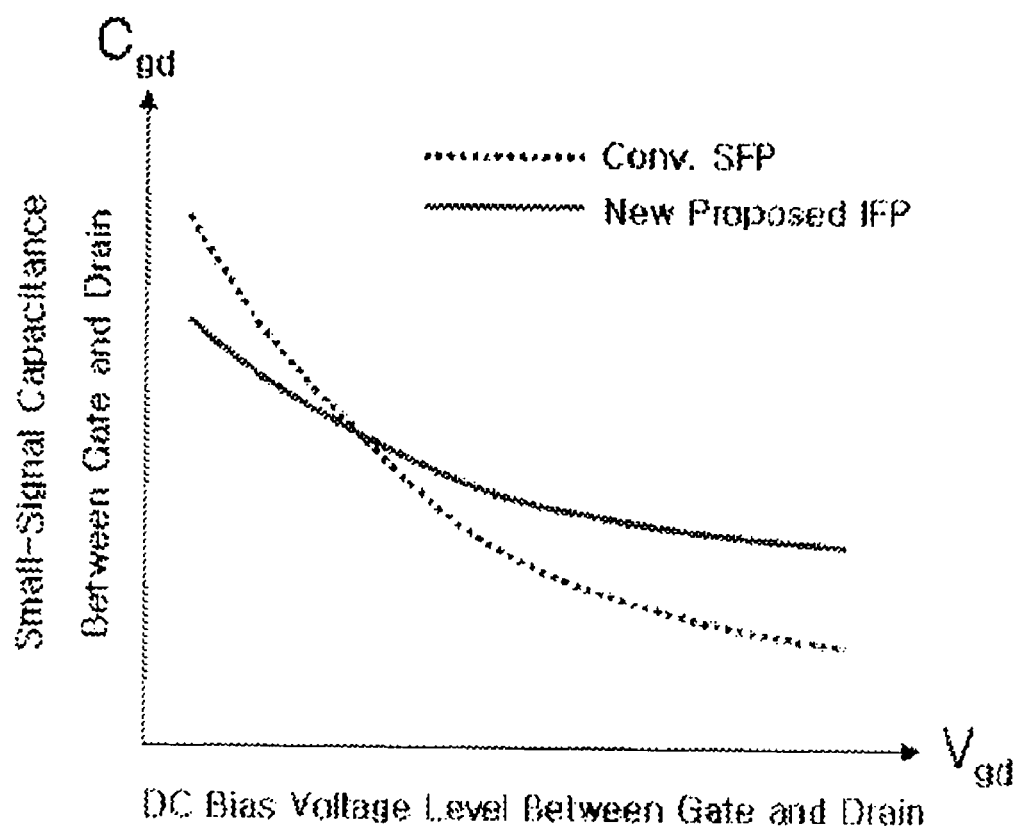

GALLIUM NITRIDE HIGH ELECTRON MOBILITY TRANSISTOR HAVING INNER FIELD-PLATE FOR HIGH POWER APPLICATIONS

BACKGROUND OF THE INVENTION

1. Field of the Invention

The present invention relates, in general, to a gallium nitride high electron mobility transistor and, more particularly, to a gallium nitride high electron mobility transistor, in which an inner field-plate is disposed between the gate and drain of the high electron mobility transistor, so that an electric field is distributed between gate and drain regions to reduce a peak value and to reduce gate leakage current while maintaining high frequency performance, thus obtaining a high breakdown voltage, reducing capacitance between the gate and the drain attributable to a shielding effect, and improving linearity, and high power and high frequency characteristics through variation in the input voltage of the inner field-plate.

2. Description of the Related Art

Generally, a High Electron Mobility Transistor (HEMT) is applied to a high power and high integration transistor, a switch, a power amplifier, a Microwave Monolithic Integrated Circuit (MMIC), etc. through the heterojunction of a compound semiconductor, such as gallium-arsenic (GaAs).

Further, in order to implement a high power Microwave Monolithic Integrated Circuit (MMIC), a transistor requires characteristics enabling it to operate at high power, high frequency and high temperature, and may have a high breakdown voltage using gallium nitride, which has an energy band gap wider than that of material belonging to group III-V.

In this case, in order to enhance the breakdown voltage of gallium nitride, a high electron mobility transistor employs a structure that uses a single electric field on a gate. Such a structure is adapted to form another electrode between a gate and a drain, which widens the electric field between the gate and the drain, thus reducing a peak value.

However, there are problems in that an electric field is not sufficiently distributed between the gate and drain regions of the high electron mobility transistor so that the electric field can be applied to microwaves, and in that the increment of a peak value relative to the electric field reduces the breakdown voltage. Further, there are problems in that, as gate leakage current increases, the gain of output voltage to input voltage is reduced, thus increasing power consumption and consequently increasing expenses, and the capacitance between the gate and the drain is increased, thus exhibiting limitations in high power and high frequency characteristics.

SUMMARY OF THE INVENTION

Accordingly, the present invention has been made keeping in mind the above problems occurring in the prior art, and an object of the present invention is to provide a gallium-nitride high electron mobility transistor, in which an inner field-plate is disposed between the gate and drain of the high electron mobility transistor, so that an electric field is distributed between gate and drain regions to reduce a peak value and to reduce gate leakage current while maintaining high frequency performance, thus obtaining a high breakdown voltage, reducing the capacitance between the gate and the drain attributable to a shielding effect, and improving linearity and high power and high frequency characteristics through variation in the input voltage of the inner field-plate, consequently realizing low power consumption and low-expense operation, and being suitable for microwave power applications.

In order to accomplish the above object, the present invention provides a gallium-nitride high electron mobility transistor, comprising a gallium nitride (GaN) buffer layer; an aluminum gallium-nitride (GaAlN) barrier layer formed on the buffer layer; a source electrode placed on the barrier layer; a drain electrode placed on the barrier layer to be spaced apart from the source electrode; a gate electrode placed on a top of the barrier layer to be spaced apart from the source electrode and the drain electrode; a dielectric layer deposited on the top of the barrier layer; an electric field electrode formed on the dielectric layer located on the gate electrode; and at least one inner field-plate formed in the dielectric layer between the gate electrode and the drain electrode to be spaced apart from the gate electrode and the drain electrode.

Preferably, the inner field electrode may be formed to overlap the electric field electrode in a stacked structure.

Preferably, the inner field-plate may be formed so that it does not overlap the electric field electrode, or so that boundaries of the inner field-plate and the electric field electrode are aligned with each other.

Preferably, a voltage to be applied to the inner field-plate may be a voltage between voltages applied to the gate electrode and the drain electrode.

Preferably, a voltage to be applied to the electric field electrode may be a voltage applied to the source electrode, the gate electrode, or the drain electrode.

Preferably, the inner field-plate may be formed so that a plurality of inner field-plates is formed between the electric field electrode and the drain electrode while overlapping each other in a sequentially stacked structure.

Preferably, the inner field-plate is formed so that a plurality of inner field-plates may be formed between the electric field electrode and the drain electrode such that the inner field-plates do not overlap each other, or such that boundaries thereof are aligned with each other.

Preferably, voltages to be applied to the plurality of inner field-plates may be voltages between voltages applied to the gate electrode and the drain electrode.

Preferably, the electric field electrode may be connected to either one of the gate electrode and the source electrode through a conductor.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a sectional view schematically showing a high electron mobility transistor according to the present invention;

FIG. 2 is a sectional view schematically showing a high electron mobility transistor according to an embodiment of the present invention;

FIG. 3 is a graph showing electric field distribution relative to the locations of a source electrode and a drain electrode according to the present invention;

FIG. 4 is a graph showing leakage current relative to voltage applied to an inner field-plate according to the present invention;

FIG. 5 is a graph showing frequency characteristics relative to voltage applied to an inner field-plate according to the present invention;

FIG. 6 is a graph showing current gain and maximum available power gain according to the present invention;

FIG. 7 is a graph showing power characteristics and gain relative to voltage applied to an inner field-plate according to the present invention; and FIG. 8 is a graph showing small signal capacitance and voltage between a gate electrode and a drain electrode according to the present invention.

DESCRIPTION OF THE PREFERRED EMBODIMENTS

Hereinafter, embodiments of the present invention will be described in detail with reference to the attached drawings.

FIG. 1 is a sectional view schematically showing a High Electron Mobility Transistor (HEMT) according to the present invention, and FIG. 2 is a sectional view schematically showing an HEMT according to an embodiment of the present invention. As shown in the drawings, an HEMT 1 is constructed so that a gallium nitride (GaN) buffer layer 10, doped with Fe through Metal Organic Chemical Vapor Deposition (MOCVD), is formed, and a barrier layer 20 is formed on the buffer layer 10.

The buffer layer 10 is preferably made of a semi-conducting material and has a thickness of 2 μm, and the barrier layer 20 is preferably made of undoped $Al_{0.27}Ga_{0.73}N$ and has a thickness of 22 nm. To isolate the devices, Remote Ion Beam Etching (RIBE), using Ar—$Cl_2$ gas which has an etch rate of 400 Å/min, is preferably applied to the gallium nitride (GaN) buffer layer 10.

Further, the HEMT 1 includes a source electrode 30 formed at a predetermined location on the top of the barrier layer 20, a drain electrode 40 formed on the top of the barrier layer 20 and spaced apart from the source electrode 30 by a predetermined distance, and a gate electrode 50 formed on the top of the barrier layer 20 and spaced apart from the source electrode 30 and the drain electrode 40 by certain distances.

The distance D1 between the gate and source electrodes is 1 μm, the distance D4 between the gate and drain electrodes is 3 μm, the length D2 of the gate electrode is 1 μm, and the width of the gate electrode is 100 μm, but these distances can vary.

In this case, the ohmic contact between the drain and source electrodes is preferably formed by depositing a multilayer structure having materials of Ti/Al/Ti/Au(150/1000/450/550 Å) through thermal evaporation and performing Rapid Thermal Annealing (RTA) on the results of deposition in a nitride ($N_2$) atmosphere at a temperature of 830° C. for 39 seconds, and the schottky junction of the gate electrode is preferably formed by depositing Ni/Au (200/3000 Å) through thermal evaporation.

Further, the HEMT 1 includes a dielectric layer 60 deposited on the top of the barrier layer 20, an electric field electrode 70 formed on the dielectric layer 60 located on the gate electrode 50, and an inner field-plate 80 formed in the dielectric layer 60 between the gate electrode 50 and the drain electrode 40 to be spaced apart from the gate electrode 50 and the drain electrode 40.

The length D3 of the electric field electrode is set at 1 μm, and may vary.

In this case, the dielectric layer 60 is preferably formed by depositing 1000 Å silicon nitride (SiNx) through Plasma Enhanced Chemical Vapor Deposition (PECVD), the inner field-plate 80 is formed in the silicon nitride (SiNx) dielectric layer 60 disposed between the gate electrode 50 and the drain electrode 40, and 1000 Å silicon nitride (SiNx) is preferably deposited again on the inner field-plate 80.

Further, an aluminum nitride (AlN) buffer layer 10 having a thickness of 0.8 mm is disposed between the barrier layer 20 and the dielectric layer 60, and the thickness thereof can vary.

Furthermore, the inner field-plate 80 may be formed so that it overlaps the electric field electrode 70 in a stacked structure, or may be formed so that it does not overlap the electric field electrode, or so that the boundaries of the inner field-plate and the electric field electrode are aligned with each other.

Further, the voltage between the voltages applied to the gate electrode 50 and the drain electrode 40 may be applied to the inner field-plate 80. The voltage applied to the source electrode 30, the gate electrode 50, or the drain electrode 40 may be applied to the electric field electrode 70.

Meanwhile, a plurality of inner field-plates 80 may be formed between the electric field electrode 70 and the drain electrode 40 while overlapping each other in a sequentially stacked structure. The inner field-plates 80 are formed between the electric field electrode 70 and the drain electrode 40, and may be formed so that they do not overlap each other or so that they have boundaries that are aligned with each other. The voltages between the voltages applied to the gate electrode 50 and the drain electrode 40 may be applied to the plurality of inner field-plates 80.

In this case, the voltages to be applied to the plurality of inner field-plates 80 may be sequentially supplied.

Further, the electric field electrode 70 may be connected to either one of the gate electrode 50 and the source electrode 30 through a conductor.

Finally, characteristics, such as breakdown voltage, output power, and linearity, can be improved by moving the inner field-plates 80.

FIG. 3 is a graph showing electric field distribution relative to the locations of the source electrode 30 and the drain electrode 40 according to the present invention. As shown in FIG. 3, the electric field of the conventional HEMT has a relatively high distribution of about 2.7 MV/cm, whereas the electric field of the HEMT according to the present invention has a low distribution of about 2.5 MV/cm, thus the characteristics of breakdown voltage are enhanced in the present invention.

FIG. 4 is a graph showing leakage current relative to voltage applied to the inner field-plate according to the present invention. The graph of FIG. 4 is described with reference to FIG. 1. As shown in FIG. 4, the characteristics of gate leakage current, obtained by varying the voltage to be applied to the inner field-plate 80 in a bias range from 0 V to −15V, are shown.

In this case, leakage current, obtained when a voltage of −15V is applied to the inner field-plate 80, is 1.6 μA, which is about 15% lower than the leakage current obtained when a voltage of 0V is applied to the inner field-plate 80, thus the characteristics of breakdown voltage are enhanced.

FIG. 5 is a graph showing frequency characteristics relative to voltage applied to the inner field-plate according to the present invention. The graph of FIG. 5 is described with reference to FIG. 1. FIG. 5 shows that, as the voltage applied to the inner field-plate 80 (inner field-plate voltage) increases, frequency characteristics are enhanced. Under optimum bias conditions, the small signal microwave characteristics were measured using an on-wafer method. Radio Frequency (RF) performances begin to be saturated when the inner field-plate voltage is 2.5V and the voltage between the drain and the gate is 5V. The small signal microwaves have higher frequencies than those of the case where the inner field-plate voltage is equal to the voltage between the drain and the gate.

In this case, it can be seen that, with variation in the voltage applied to the inner field-plate 80, $f_T$ (maximum current gain cutoff frequency) increases from 4.89 GHz to 6.9 GHz, and $f_{MAX}$ (maximum oscillation frequency) increases from 9.96 GHz to 14.4 GHz.

FIG. 6 is a graph showing current gain and maximum available power gain according to the present invention. As shown in the drawing, under optimum bias conditions, small signal microwave characteristics were measured using an on-wafer method, and the results of measurement of current gain $H_{21}$ and maximum available power gain Gmax are described below.

The measured $f_T$ (maximum current gain cutoff frequency) and $f_{MAX}$ (maximum oscillation frequency) have 4.89 GHz and 9.96 GHz, respectively, when the inner field-plate voltage is 0V, and is equal to the voltage between the gate and the source, and have 6.9 GHz and 14.4 GHz, respectively, when the inner field-plate voltage is 2.5V, and is equal to half of the voltage between the drain and the gate.

FIG. 7 is a graph showing power characteristics and gain relative to voltage applied to the inner field-plate according to the present invention. As shown in FIG. 7, at a frequency of 2 GHz, when the inner field-plate voltage and the voltage between the gate and the source are −1 V, and when the inner field-plate voltage and half of the voltage between the drain and the gate are 8 V, power was measured using an on-wafer load pull measurement method.

In this case, the HEMT according to the present invention exhibits power and gain characteristics indicating that, when the voltage between the drain and the source is 15 V, and the inner field-plate voltage and the voltage between the gate and the source is −1 V, maximum output power is 15.5 dBm, and maximum gain is 12.8 dB, and when the inner field-plate voltage and half of the voltage between the drain and the gate are 8V, maximum output power is 16.4 dBm, and maximum gain is 13.5 dB. In the case where the inner field-plate voltage is equal to half of the voltage between the drain and the gate, which satisfies optimum bias conditions, output power relative to input power is increased, compared to the case where the inner field-plate voltage is equal to the voltage between the gate and the source.

In other words, output power Pout, which indicates output power characteristics, increases from 15.5 dBm to 16.4 dBm, and gain increases from 12.8 dB to 13.5 dB, so that capacitance cgd, caused by a shielding effect, can be decreased.

FIG. 8 is a graph showing the small signal capacitance and voltage between the gate electrode and the drain electrode according to the present invention. The graph of FIG. 8 is described with reference to FIG. 1. As shown in the drawing, when the voltage between the voltages applied to the gate electrode and the drain electrode is applied to the inner field-plate 80, a small signal capacitance value between the gate electrode and the drain electrode according to variation in the voltage between the gate electrode and the drain electrode exhibits certain characteristics.

As described above, the present invention having the above construction is advantageous in that an inner field-plate is disposed between the gate and drain of a high electron mobility transistor, so that an electric field is distributed between gate and drain regions to reduce a peak value and to reduce gate leakage current while maintaining high frequency performance, thus obtaining a high breakdown voltage, reducing the capacitance between the gate and the drain attributable to a shielding effect, and improving linearity and high power and high frequency characteristics through variation in the input voltage of the inner field-plate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A gallium-nitride high electron mobility transistor, comprising:
    a gallium nitride (GaN) buffer layer;
    an aluminum gallium-nitride (GaAlN) barrier layer formed on the buffer layer;
    a source electrode placed on the barrier layer;
    a drain electrode placed on the barrier layer to be spaced apart from the source electrode;
    a gate electrode placed on a top of the barrier layer to be spaced apart from the source electrode and the drain electrode;
    a dielectric layer deposited on the top of the barrier layer;
    an electric field electrode formed on the dielectric layer located on the gate electrode; and
    at least one inner field-plate formed in the dielectric layer between the gate electrode and the drain electrode to be spaced apart from the gate electrode and the drain electrode,
    wherein the inner field-plate is electrically separated from the source electrode, the drain electrode, the gate electrode and the electric field electrode.

2. The high electron mobility transistor according to claim 1, wherein the inner field electrode is formed to overlap the electric field electrode in a stacked structure.

3. The high electron mobility transistor according to claim 1, wherein the inner field-plate is formed so that it does not overlap the electric field electrode, or so that boundaries of the inner field-plate and the electric field electrode are aligned with each other.

4. The high electron mobility transistor according to claim 1, wherein a voltage to be applied to the inner field-plate is a voltage between voltages applied to the gate electrode and the drain electrode.

5. The high electron mobility transistor according to claim 4, wherein a voltage to be applied to the electric field electrode is a voltage applied to the source electrode, the gate electrode, or the drain electrode.

6. The high electron mobility transistor according to claim 1, wherein the inner field-plate is formed so that a plurality of inner field-plates is formed between the electric field electrode and the drain electrode while overlapping each other in a sequentially stacked structure.

7. The high electron mobility transistor according to claim 1, wherein the inner field-plate is formed so that a plurality of inner field-plates is formed between the electric field electrode and the drain electrode such that the inner field-plates do not overlap each other, or such that boundaries thereof are aligned with each other.

8. The high electron mobility transistor according to claim 6 or 7, wherein voltages to be applied to the plurality of inner field-plates are voltages between voltages applied to the gate electrode and the drain electrode.

9. The high electron mobility transistor according to claim 1, wherein the electric field electrode is connected to either one of the gate electrode and the source electrode through a conductor.

* * * * *